United States Patent
Mizunashi et al.

(10) Patent No.: US 10,556,993 B2
(45) Date of Patent: Feb. 11, 2020

(54) ADDITION-CURABLE ORGANOPOLYSILOXANE RESIN COMPOSITION, CURED PRODUCT THEREOF, AND SEMICONDUCTOR DEVICE HAVING THE CURED PRODUCT

(71) Applicant: Shin-Etsu Chemical Co., Ltd., Tokyo (JP)

(72) Inventors: Tomoyuki Mizunashi, Annaka (JP); Hiroyuki Iguchi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 97 days.

(21) Appl. No.: 15/888,269

(22) Filed: Feb. 5, 2018

(65) Prior Publication Data
US 2018/0258227 A1  Sep. 13, 2018

(30) Foreign Application Priority Data
Mar. 9, 2017 (JP) ................................. 2017-044875

(51) Int. Cl.
| | |
|---|---|
| *H01L 23/29* | (2006.01) |
| *C08L 83/04* | (2006.01) |
| *C08G 77/08* | (2006.01) |
| *C08G 77/20* | (2006.01) |
| *C08G 77/12* | (2006.01) |
| *H01L 33/56* | (2010.01) |
| *C08G 77/00* | (2006.01) |
| *H01L 33/50* | (2010.01) |

(52) U.S. Cl.
CPC .............. *C08G 77/08* (2013.01); *C08L 83/04* (2013.01); *H01L 23/296* (2013.01); *C08G 77/12* (2013.01); *C08G 77/20* (2013.01); *C08G 77/70* (2013.01); *C08L 2203/206* (2013.01); *H01L 33/501* (2013.01); *H01L 33/56* (2013.01); *H01L 2933/005* (2013.01); *H01L 2933/0033* (2013.01)

(58) Field of Classification Search
CPC ............ C08L 83/04; C08K 3/105; C08K 3/18
USPC ......................................................... 524/588
See application file for complete search history.

(56) References Cited

U.S. PATENT DOCUMENTS

| | | | | |
|---|---|---|---|---|
| 3,261,801 A | * | 7/1966 | Wormuth .................. | C08K 3/18 524/431 |
| 5,674,966 A | * | 10/1997 | McDermott ........... | C08G 77/20 525/477 |
| 5,866,640 A | * | 2/1999 | Honma .................... | C08L 83/04 523/212 |
| 6,124,407 A | * | 9/2000 | Lee ......................... | C08L 83/04 257/E23.12 |
| 2001/0006992 A1 | * | 7/2001 | Yoshida .................. | C08L 83/04 524/588 |
| 2009/0118441 A1 | | 5/2009 | Yamamoto et al. | |
| 2010/0280163 A1 | | 11/2010 | Hasegawa et al. | |
| 2011/0136961 A1 | * | 6/2011 | Hattori .................. | B60C 1/0016 524/493 |
| 2014/0275384 A1 | | 9/2014 | Takahashi | |

FOREIGN PATENT DOCUMENTS

| | | |
|---|---|---|
| JP | 2006-213789 A | 8/2006 |
| JP | 2007-131694 A | 5/2007 |
| JP | 2011-252175 A | 12/2011 |
| JP | 2012-214554 A | 11/2012 |
| JP | 2013-204029 A | 10/2013 |
| WO | WO 2008/082001 A1 | 7/2008 |
| WO | WO 2013/084699 A1 | 6/2013 |

* cited by examiner

*Primary Examiner* — Marc S Zimmer
(74) *Attorney, Agent, or Firm* — Birch, Stewart, Kolasch & Birch, LLP

(57) ABSTRACT

Provided is an addition-curable organopolysiloxane resin composition capable of forming a cured product having a superior transparency, heat resistance and light resistance. The addition-curable organopolysiloxane resin composition contains:
(A) an organopolysiloxane having in one molecule at least two silicon-atom-bonded alkenyl groups each having 2 to 10 carbon atoms;
(B) an organohydrogenpolysiloxane having in one molecule at least two silicon-atom-bonded hydrogen atoms;
(C) a platinum group metal-based catalyst; and
(D) a barium compound represented by the following formula (1)

Ba(OR)$_2$         (1)

wherein R represents a monovalent hydrocarbon group having 1 to 10 carbon atoms; or an acyl group having 2 to 15 carbon atoms.

6 Claims, No Drawings

ADDITION-CURABLE ORGANOPOLYSILOXANE RESIN COMPOSITION, CURED PRODUCT THEREOF, AND SEMICONDUCTOR DEVICE HAVING THE CURED PRODUCT

BACKGROUND OF THE INVENTION

Field of the Invention

The present invention relates to an addition-curable organopolysiloxane resin composition containing a particular barium compound; a cured product of such composition; and a semiconductor device having such cured product.

Background Art

As an LED encapsulation material, those also exhibiting a superior heat resistance, light resistance, workability, adhesion, gas barrier property and curing property are demanded. Conventionally, there have been often used epoxy resins; and thermoplastic resins such as poly (meth) acrylate and polycarbonate. However, as LED light-emitting devices of recent years have shown higher outputs, it is now clear that there exists a problem that heat resistance and discoloration resistance will be impaired if using these thermoplastic resins under a high-temperature environment for a long period of time.

Further, a lead-free solder has been used more often in recent days to solder an optical element(s) to a substrate. Since such lead-free solder has a melting point higher than that of a conventional solder, soldering has to be performed at a temperature of not lower than 260° C. if using the same. However, as a result of performing soldering at such temperature, there will occur problems such as deformation if using the conventional thermoplastic resins as encapsulation materials; or yellowing of such encapsulation material itself due to a high temperature.

In this way, an encapsulation material is now required to exhibit a heat resistance more excellent than ever in consideration of the higher outputs of the LED light-emitting devices and the usage of the lead-free solder. Although there have been proposed, for example, optical resin compositions each obtained by filling a thermoplastic resin with a nano silica for the purpose of improving heat resistance (JP-A-2012-214554 and JP-A-2013-204029), a sufficient heat resistance has not been able to be achieved due to the limitation in the heat resistance of a thermoplastic resin.

Meanwhile, silicone resins as heat-curable resins have been considered as LED encapsulation materials, since they are superior in heat resistance, light resistance and light transmissibility (JP-A-2006-213789, JP-A-2007-131694 and JP-A-2011-252175). However, as LEDs have shown higher outputs, even a silicone resin superior in heat resistance and light resistance will undergo resin oxidation and coloring, and exhibit cracks due to an increase in hardness, when exposed to a temperature greater than 200° C.

As a countermeasure to these problems, there has been considered the usage of a heat stabilizer in a heat-curable silicone resin. Cerium oxide and/or a cerium carboxylate are, for example, used as such heat stabilizer; and it has been confirmed that they bring about an effect of maintaining an initial transmissibility, and an effect of restricting a change in hardness, for example (WO2008/082001 and WO2013/084699). However, there have been observed a significant decrease in the initial transmissibility due to coloring by a heat stabilizer, and a decrease in the luminance of an LED device when such heat stabilizer is used as an encapsulation material for LED device. Therefore, it is required that there be developed an encapsulation material that is not only superior in heat resistance, but also has a high initial transmissibility, and does not cause a light loss in an optical semiconductor device.

SUMMARY OF THE INVENTION

Thus, it is an object of the invention to provide an addition-curable organopolysiloxane resin composition capable of forming a cured product superior in heat resistance, light resistance and transparency; such curd product of the composition; and a semiconductor device having such cured product.

The inventors of the invention diligently conducted a series of studies to solve the above problems, and completed the invention as follows. That is, the inventors found that the aforementioned objectives could be achieved by adding a particular barium compound to an addition-curable organopolysiloxane resin composition. Particularly, the present invention is to provide the following addition-curable organopolysiloxane resin composition.

[1]

An addition-curable organopolysiloxane resin composition comprising:

(A) an organopolysiloxane having in one molecule at least two silicon-atom-bonded alkenyl groups each having 2 to 10 carbon atoms, said organopolysiloxane being in an amount of 60 to 90% by mass per a total amount of components (A) to (D);

(B) an organohydrogenpolysiloxane having in one molecule at least two silicon-atom-bonded hydrogen atoms, said organohydrogenpolysiloxane being in an amount of 5 to 40% by mass per the total amount of components (A) to (D);

(C) a platinum group metal-based catalyst, said platinum group metal-based catalyst being in an amount of 0.00001 to 0.01% by mass in terms of platinum group metal, per the total amount of components (A) to (D); and (D) a barium compound that is in an amount of 0.001 to 10.0% by mass per the total amount of components (A) to (D), and is represented by the following formula (1)

$$Ba(OR)_2 \qquad (1)$$

wherein R represents a monovalent hydrocarbon group having 1 to 10 carbon atoms; or an acyl group having 2 to 15 carbon atoms.

[2]

The addition-curable organopolysiloxane resin composition according to [1], wherein the component (A) comprises:

(A1) 1 to 99% by mass of an aryl group-containing organopolysiloxane having, in one molecule, at least one silicon-atom-bonded aryl group having 6 to 10 carbon atoms; and at least two silicon-atom-bonded alkenyl groups each having 2 to 10 carbon atoms, said aryl group-containing organopolysiloxane (A1l) exhibiting a viscosity of 10 to 100,000 mPa·s at 25° C. when measured by a method described in JIS K 7117-1:1999; and (A2) 1 to 99% by mass of a resin-structure organopolysiloxane containing at least one of an $SiO_{4/2}$ unit and an $R^1SiO_{3/2}$ unit ($R^1$ independently represents a monovalent hydrocarbon group having 1 to 10 carbon atoms); and having, in one molecule, at least two silicon-atom-bonded alkenyl groups each having 2 to 10 carbon atoms, and at least one silicon-atom-bonded hydroxyl group, said silicon-atom-bonded hydroxyl group(s) being present in an amount of 0.005 to 1.0 mol/100 g, provided that a total content of the components (A1) and (A2) is 100% by mass, and wherein the component (B) is an organohydrogenpolysiloxane having, in one molecule, at least two silicon-atom-bonded hydrogen atoms, and at least one silicon-atom-bonded aryl group having 6 to 10 carbon atoms, said organohydrogenpolysiloxane being in an amount of 5 to 40% by mass per the total amount of components (A) to (D).

[3]

The addition-curable organopolysiloxane resin composition according to [1] or [2], wherein the component (D) comprises at least one selected from dimethoxy barium, diethoxy barium, diisopropoxy barium, di-n-propoxy barium, di-n-butoxy barium, diisobutoxy barium, di-sec-butoxy barium, di-t-butoxy barium, barium octanoate and barium 2-ethylhexanoate.

[4]

A cured product of the addition-curable organopolysiloxane resin composition as set forth in any one of [1] to [3].

[5]

A semiconductor device having the cured product as set forth in [4].

The addition-curable organopolysiloxane resin composition of the invention can be turned into a cured product having a superior transparency, heat resistance and light resistance, through curing.

DETAILED DESCRIPTION OF THE INVENTION

The present invention is described in detail hereunder. However, the present invention is not limited to the following examples.

(A) Organopolysiloxane

It is preferred that an organopolysiloxane as a component (A) of the invention be comprised of: a component (A1) which is a linear or partially branched organopolysiloxane containing an aryl group(s); and a component (A2) which is an organopolysiloxane having a resin structure.

The component (A1) is an aryl group-containing organopolysiloxane having, in one molecule, at least one silicon-atom-bonded aryl group having 6 to 10 carbon atoms; and at least two silicon-atom-bonded alkenyl groups each having 2 to 10 carbon atoms.

The viscosity of the component (A1) at 25° C. is 10 to 100,000 mPa·s when measured by a method described in JIS K 7117-1:1999. It is preferred that such viscosity of the component (A1) be 100 to 50,000 mPa·s, more preferably 1,000 to 30,000 mPa·s.

When the viscosity of the component (A1) is not lower than 10 mPa·s, there does not exist a concern that a cured product will become brittle. When the viscosity of the component (A1) is not higher than 100,000 mPa·s, there does not exist a concern that a workability will be impaired.

As the aryl group in the component (A1) that has 6 to 10 carbon atoms, there can be listed, for example, a phenyl group, a tolyl group, a xylyl group and a naphthyl group, among which a phenyl group is particularly preferred.

As the alkenyl group in the component (A1) that has 2 to 10 carbon atoms, there can be listed, for example, a vinyl group, an allyl group, a propenyl group, an isopropenyl group, a butenyl group, a hexenyl group, a cyclohexenyl group and an octenyl group, among which a vinyl group is particularly preferred.

Other than the aforementioned aryl group and alkenyl group, examples of a silicon-atom-bonded group(s) in the component (A1) include an alkyl group such as a methyl group, an ethyl group, a propyl group, an isopropyl group, a butyl group, an isobutyl group, a tert-butyl group, a pentyl group, a neopentyl group, a hexyl group, a cyclohexyl group, an octyl group, a nonyl group and a decyl group; an aralkyl group such as a benzyl group, a phenylethyl group and a phenylpropyl group; and groups obtained by substituting a part of or all the hydrogen atoms in any of these groups with a cyano group and/or halogen atoms such as a fluorine atom, a bromine atom and a chlorine atom. Here, examples of such substituted groups include a cyanoethyl group; and halogen-substituted alkyl groups such as a chloromethyl group, a chloropropyl group, a bromoethyl group and a trifluoropropyl group. Among all the aforementioned groups, a methyl group is preferred.

Specific examples of the component (A1) are as follows.

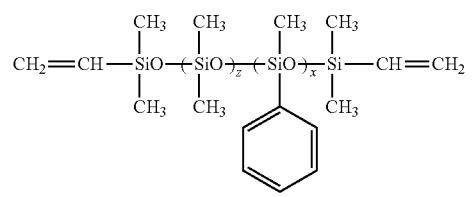

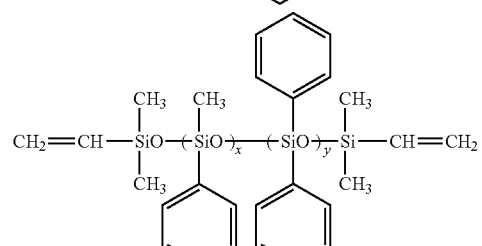

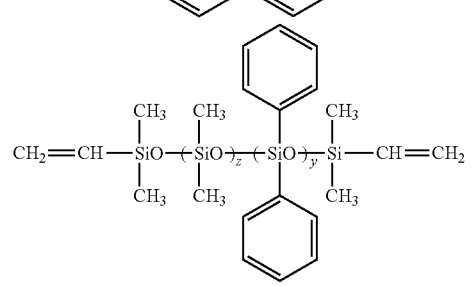

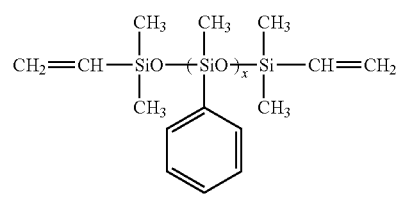

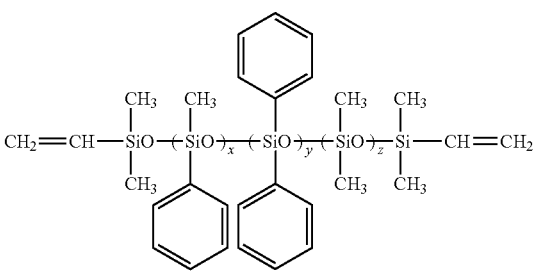

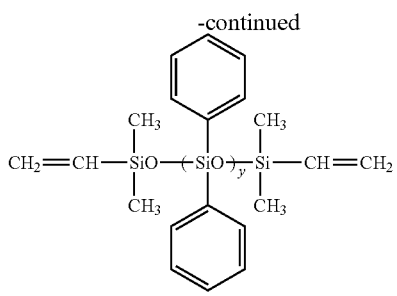
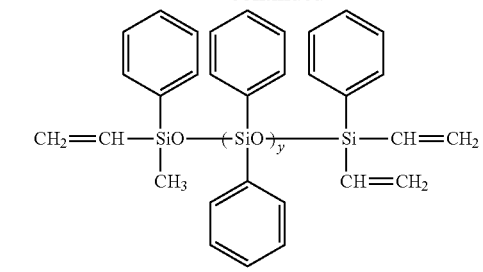
In the above formula, each of x, y and z represents an integer of not smaller than 0; and x and y are numbers satisfying x+y≥1.

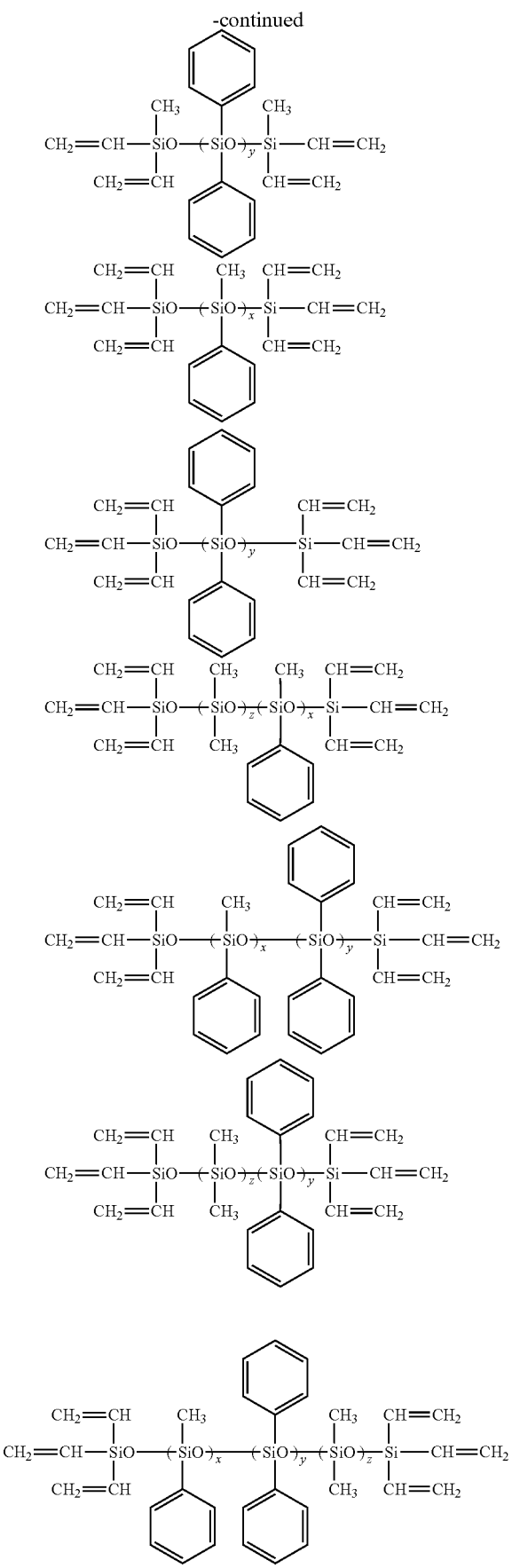

In the above formula, each of x, y and z represents an integer of not smaller than 0; and x and y are numbers satisfying x+y≥1.

The component (A2) is a resin-structure organopolysiloxane containing at least one of an $SiO_{4/2}$ unit and an $R^1SiO_{3/2}$ unit ($R^1$ independently represents a monovalent hydrocarbon group having 1 to 10 carbon atoms); and having, in one molecule, at least two silicon-atom-bonded alkenyl groups each having 2 to 10 carbon atoms, and at least one silicon-atom-bonded hydroxyl group (silanol group), such hydroxyl group(s) being present in an amount of 0.005 to 1.0 mol/100 g.

It is preferred that the component (A2) contain the $SiO_{4/2}$ unit (Q unit) and the $R^1SiO_{3/2}$ unit (T unit) by an amount of 40 to 95 mol % in total, more preferably 50 to 90 mol % in total. Further, the component (A2) may also contain an $R^2{}_2SiO_{2/2}$ unit (D unit) and/or an $R^3{}_3SiO_{1/2}$ unit (M unit).

The component (A2) having such a kind of composition can be synthesized by mixing the following materials as the sources for the abovementioned units, at desired molar ratios. For example, the component (A2) can be synthesized by condensing these materials either through cohydrolytic condensation performed under the presence of an acid catalyst or a base catalyst; or through a dealkoxy reaction effected by a metal salt or a metal hydroxide.

$R^1$ in T unit represents a monovalent hydrocarbon group having 1 to 10 carbon atoms, preferably 1 to 6 carbon atoms. Specific examples of such monovalent hydrocarbon group represented by $R^1$ include lower an alkyl group such as a methyl group, an ethyl group, a propyl group and a butyl group; a cycloalkyl group such as a cyclohexyl group; an aryl group such as a phenyl group, a tolyl group and a xylyl group; an aralkyl group such as a benzyl group; an alkenyl group such as a vinyl group, an allyl group, a propenyl group, an isopropenyl group, a butenyl group, a hexenyl group, a cyclohexenyl group and an octenyl group; and groups obtained by substituting a part of or all the hydrogen atoms in any of these groups with, for example, a cyano group and/or halogen atoms such as a fluorine atom, a bromine atom and a chlorine atom. Here, examples of such substituted groups include a chloromethyl group, a cyanoethyl group and a 3,3,3-trifluoropropyl group. Among all the aforementioned groups, a methyl group and a phenyl group are preferred.

Each of $R^2$ in D unit and $R^3$ in M unit represents a monovalent hydrocarbon group having 1 to 10 carbon atoms, preferably 1 to 6 carbon atoms. Specific examples of such $R^2$ and $R^3$ include groups similar to those listed above.

Examples of the sources for the $SiO_{4/2}$ unit (Q unit) include, but are not limited to sodium silicate, tetraalkoxysilane and a condensation reaction product of tetraalkoxysilane.

Examples of the sources for the $R^1SiO_{3/2}$ unit (T unit) include, but are not limited to: organic silicon compounds such as an organotrichlorosilane and an organotrialkoxysilane that are represented by the following structural formulae; condensation reaction products of these organotrichlorosilane and organotrialkoxysilane; and an organic silicon compound having an $HSiO_{2/2}$ unit(s) capable of being subjected to dehydrogenation reaction.

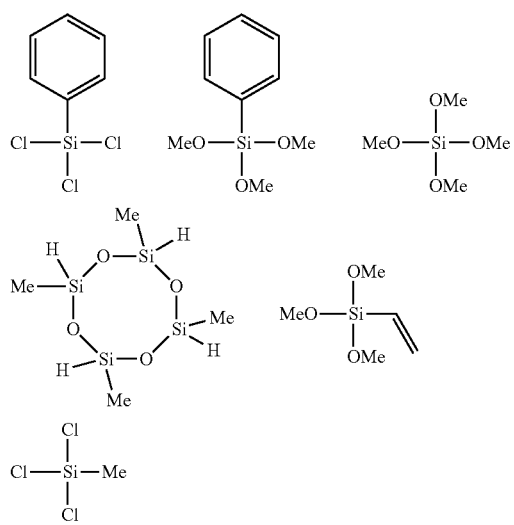

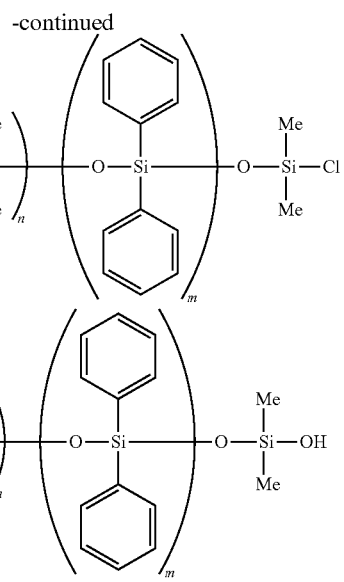

In the above formulae, Me represents a methyl group.

Examples of the sources for the $R^2{}_2SiO_{2/2}$ unit (D unit) include, but are not limited to organic silicon compounds such as a diorganodichlorosilane and a diorganodialkoxysilane that are represented by the following structural formulae.

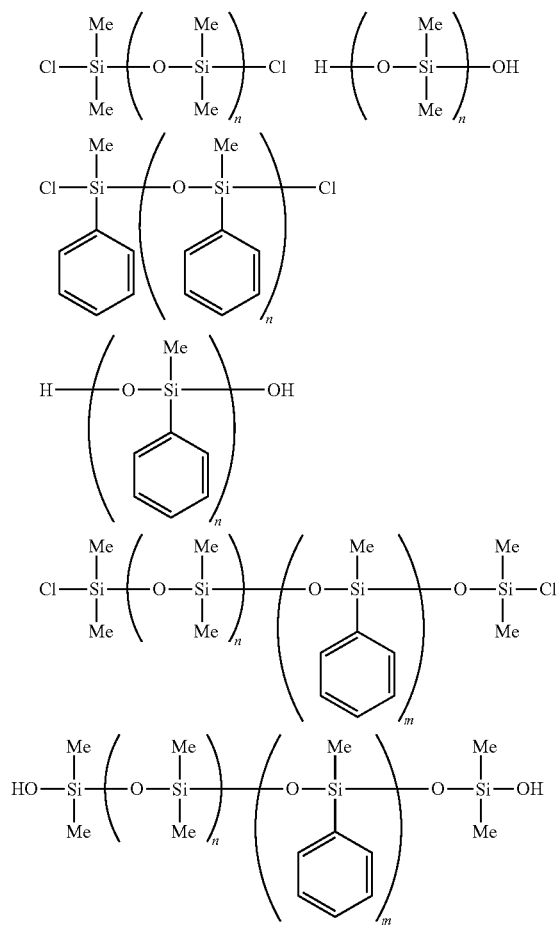

In the above formulae, n represents an integer of 0 to 100, and m represents an integer of 0 to 100. Me represents a methyl group.

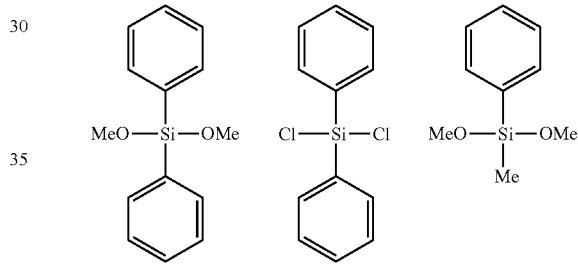

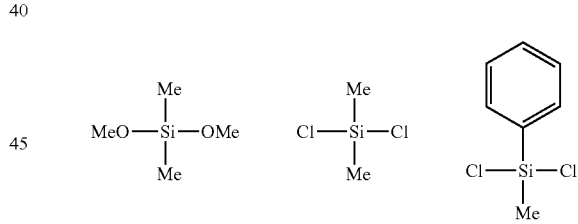

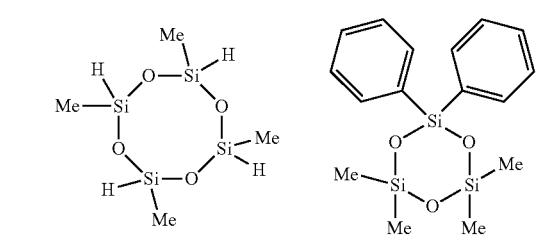

In the above formulae, Me represents a methyl group, and Ph represents a phenyl group.

Examples of the sources for the $R^3{}_3SiO_{1/2}$ unit (M unit) include, but are not limited to organic silicon compounds such as a triorganochlorosilane, a triorganoalkoxysilane and a hexaorganodisiloxane that are represented by the following structural formulae.

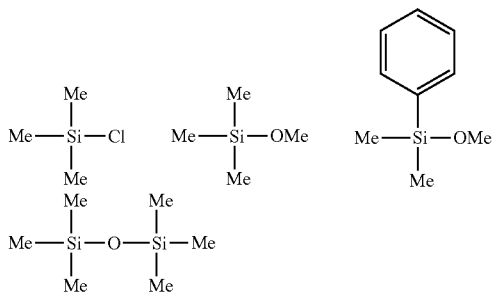

In the above formulae, Me represents a methyl group.

As the alkenyl groups in the component (A2), each having 2 to 10 carbon atoms, there can be listed, for example, a vinyl group, an allyl group, a propenyl group, an isopropenyl group, a butenyl group, a hexenyl group, a cyclohexenyl group and an octenyl group, among which a vinyl group is particularly preferred.

The alkenyl groups in the component (A2) may be contained in any of the aforementioned T unit, D unit and M unit.

The component (A2) has, in one molecule, at least one silicon-atom-bonded hydroxyl group (silanol group); and such hydroxyl group(s) are present in an amount of 0.005 to 1.0 mol/100 g, preferably 0.008 to 0.8 mol/100 g.

When the silicon-atom-bonded hydroxyl group(s) in the component (A2) are in an amount of not smaller than 0.005 mol/100 g, there does not exist a concern that a barium compound will be gelatinized due to destabilization. When such silicon-atom-bonded hydroxyl group(s) in the component (A2) are in an amount of not larger than 1.0 mol/100 g, there does not exist a concern that dust adherence will occur due to a surface tackiness after curing.

In the present invention, the amount of the silicon-atom-bonded hydroxyl groups refers to a value measured by $^1$H-NMR and $^{29}$Si-NMR.

The weight-average molecular weight (Mw) of the organopolysiloxane as the component (A2) of the present invention is 1,500 to 20,000, preferably 2,000 to 10,000. When such molecular weight is not smaller than 1,500, there does not exist a concern that a composition will not be cured. When such molecular weight is not higher than 10,000, there does not exist a concern that a composition will solidify and stop flowing thereafter.

In the present invention, the weight-average molecular weight (Mw) refers to a weight-average molecular weight measured by gel permeation chromatography (GPC) under the following conditions, with polystyrene being a standard substance.

Measurement condition
Developing solvent: tetrahydrofuran (THF)
Flow rate: 0.6 mL/min
Detector: differential refractive index detector (RI)
Column: TSK Guardcolumn Super H-L
TSK gel Super H4000 (6.0 mm I.D.×15 cm×1)
TSK gel Super H3000 (6.0 mm I.D.×15 cm×1)
TSK gel Super H2000 (6.0 mm I.D.×15 cm×2)
(all columns by Tosoh Corporation)
Column temperature: 40° C.
Sample injection volume: 20 μL (THF solution with concentration of 0.5 weight %)

The component (A1) is contained in the component (A) by an amount of 1 to 99% by mass, preferably 1 to 70% by mass, and more preferably 2 to 50% by mass.

Further, the component (A2) is contained in the component (A) by an amount of 1 to 99% by mass, preferably 40 to 99% by mass, and more preferably 60 to 98% by mass.

It is preferred that the component (A) be contained in the composition of the invention by an amount of 50 to 90% by mass, more preferably 60 to 87% by mass, and even more preferably 70 to 85% by mass.

(B) Organohydrogenpolysiloxane

An organohydrogenpolysiloxane as a component (B) has, in one molecule, at least two (normally 2 to 200), preferably at least three (normally 3 to 100) silicon-atom-bonded hydrogen atoms (SiH groups). The component (B) reacts with the component (A), and serves as a cross-linking agent.

Further, it is preferred that the organohydrogenpolysiloxane as the component (B) have, in one molecule, at least one silicon-atom-bonded aryl group having 6 to 10 carbon atoms.

As such aryl group in the component (B) that has 6 to 10 carbon atoms, there can be listed a phenyl group, a tolyl group, a xylyl group and a naphthyl group, among which a phenyl group is particularly preferred.

There are no particular restrictions on the molecular structure of the component (B). The component (B) may have any molecular structure selected from, for example, a linear structure, an annular structure, a branched structure and a three-dimensional network structure (resin type). When the component (B) has a linear structure, the SiH groups may be present either at a molecular chain terminal or on a side chain, or present both at the molecular chain terminal and on the side chain. Further, the number of the silicon atoms in one molecule of the component (B) (or polymerization degree) is normally 2 to 200, preferably 3 to 100. As such component (B), there may be used an organohydrogenpolysiloxane that is liquid or solid at room temperature (25° C.).

It is preferred that the component (B) be represented by the following average composition formula (2).

$$R^4{}_h H_i SiO_{(4-h-i)/2} \tag{2}$$

In the formula (2), $R^4$ represents an identical or different substituted or unsubstituted monovalent organic group having 1 to 10 carbon atoms. h and i are preferably positive numbers satisfying 0.7≤h≤2.1, 0.001≤i≤1.0 and 0.8≤h+i≤3.0; more preferably positive numbers satisfying 1.0≤h≤2.0, 0.01≤i≤1.0 and 1.5≤h+i≤2.5.

Specific examples of the above $R^4$ include a hydroxyl group; a monovalent hydrocarbon group (e.g. a saturated aliphatic hydrocarbon group such as a methyl group, an ethyl group, a propyl group, a butyl group and a pentyl group; a saturated cyclic hydrocarbon group such as a cyclopentyl group and a cyclohexyl group; an aromatic hydrocarbon group such as an aralkyl group including a phenyl group, a tolyl group, a benzyl group, a phenylethyl group and a phenylpropyl group; and groups obtained by substituting a part of or all the carbon atom-bonded hydrogen atoms in any of these groups with halogen atoms such as a fluorine atom, a bromine atom and a chlorine atom, such substituted groups including halogenated monovalent hydrocarbon groups such as a trifluoropropyl group and a chloropropyl group); a trialkylsilyl group (e.g. a trimethylsilyl group, a dimethylphenylsilyl group and a diphenylmethylsilyl group); an alkoxy group (e.g. a methoxy group, an ethoxy group and a propenoxy group); and an alkoxyalkyl group (e.g. a methoxymethyl group and a methoxyethyl group). Among these groups, preferred are saturated hydrocarbon groups each having 1 to 5 carbon atoms, such as a methyl group, an ethyl group and a propyl group; and a phenyl group.

Specific examples of the organohydrogenpolysiloxane represented by the above average composition formula (2), include bis (dimethylhydrogensiloxy) diphenylsilane; tris (hydrogendimethylsiloxy) phenyl silane; a methylhydrogensiloxane-diphenylsiloxane copolymer both terminals of which are blocked by trimethylsiloxy groups; a methylhydrogensiloxane-diphenylsiloxane-dimethylsiloxane copolymer both terminals of which are blocked by trimethylsiloxy groups; a methylhydrogensiloxane-methylphenylsiloxane-dimethylsiloxane copolymer both terminals of which are blocked by trimethylsiloxy groups; a methylhydrogensiloxane-dimethylsiloxane-diphenylsiloxane copolymer both terminals of which are blocked by dimethylhydrogensiloxy groups; a methylhydrogensiloxane-dimethylsiloxane-methylphenylsiloxane copolymer both terminals of which are blocked by dimethylhydrogensiloxy groups; and a copolymer comprised of a $(CH_3)_2 HSiO_{1/2}$ unit, an $SiO_{4/2}$ unit and a $(C_6H_5)_3SiO_{1/2}$ unit.

Further, there may also be employed organohydrogenpolysiloxanes that are represented by the following structures; and are obtained by performing hydrolytic condensation on organic silicon compounds such as organotrichlorosilane and organotrialkoxysilane, using an acid catalyst or a base catalyst. However, the organohydrogenpolysiloxane as the component (B) is not limited to the examples below.

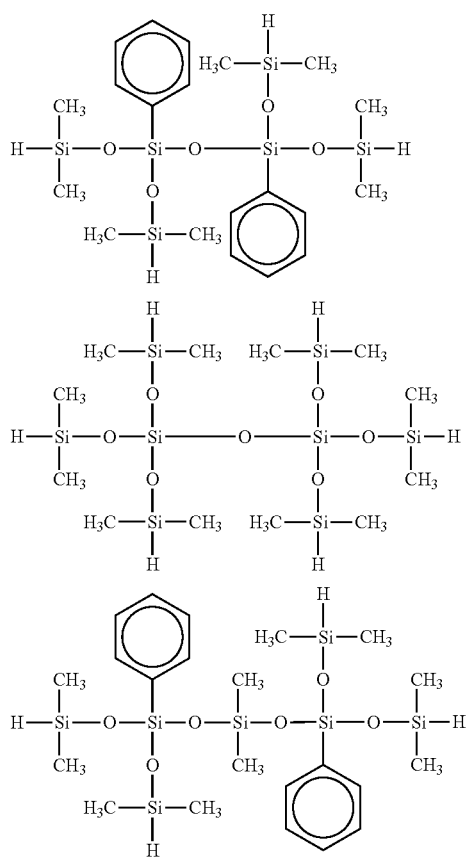

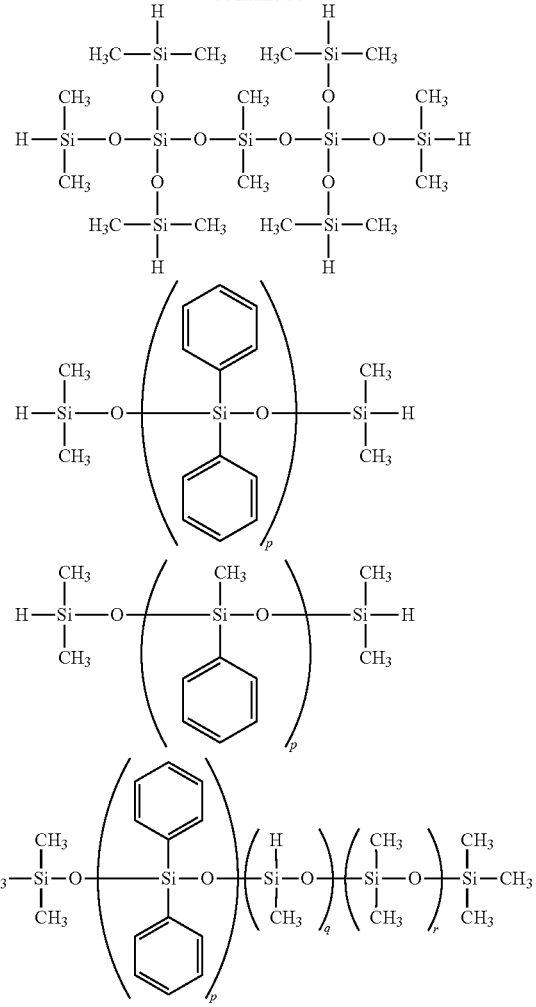

In the above formulae, p, q and r are positive integers.

It is preferred that the component (B) be added in an amount at which the amount of the SiH groups in the component (B) becomes 0.1 to 4.0 mol, preferably 0.5 to 3.0 mol, more preferably 0.8 to 2.0 mol, per 1 mol of the silicon-atom-bonded alkenyl groups in the component (A).

When the component (B) is added in an amount at which the above amount of the SiH groups in the component (B) becomes smaller than 0.1 mol, the curing reaction of the composition of the invention will not progress in a way such that it will be difficult to obtain a cured product thereof. Further, when such amount of the SiH groups in the component (B) is smaller than 0.1 mol, the cured product obtained will exhibit an extremely low crosslink density, an insufficient mechanical strength and a low heat resistance. Meanwhile, when such amount of the SiH groups in the component (B) added is larger than 4.0 mol, a great number of unreacted SiH groups will remain in the cured product in a way such that, for example, a long-term reliability and the heat resistance of the cured product will be impaired. Also, it is not preferable when the above amount of the SiH groups in the component (B) is larger than 4.0 mol, because such amount will become the cause for generating voids in the cured product due to dehydrogenation reaction.

(C) Platinum Group Metal-based Catalyst

A platinum group metal-based catalyst as a component (C) is added to promote an addition curing reaction of the composition of the invention. Such catalyst as the component (C) may be platinum-based, palladium-based or rhodium-based. As this catalyst, there can be used any known catalyst for promoting hydrosilylation reaction. In terms of cost, a platinum-based catalyst such as platinum, platinum black and chloroplatinic acid is preferred. Examples of such platinum-based catalyst include $H_2PtCl_6 \cdot pH_2O$; $K_2PtCl_6$; $KHPtCl_6 \cdot pH_2O$; $K_2PtCl_4$; $K_2PtCl_4 \cdot pH_2O$; $PtO_2 \cdot pH_2O$; $PtCl_4 \cdot pH_2O$; $PtCl_2$; and $H_2PtCl_4 \cdot pH_2O$, provided that each "p" represents a positive integer. Examples of the platinum-based catalyst further include complexes comprised of: the abovementioned platinum-based catalysts; and hydrocarbons such as olefin, alcohols or vinyl group-containing organopolysiloxanes. Any one of the aforementioned catalysts may be used alone, or two or more of them may be used in combination.

The amount of the component (C) added may simply be an effective amount for curing; and is normally 0.1 to 500 ppm, particularly preferably 0.5 to 100 ppm, in terms of mass of platinum group metal with respect to a total mass of the components (A) and (B).

(D) Barium Compound

A component (D) is a barium compound represented by the following formula (1).

$$Ba(OR)_2 \quad (1)$$

In the above formula (1), R represents a monovalent hydrocarbon group having 1 to 10 carbon atoms; or an acyl group having 2 to 15 carbon atoms.

Although barium compounds are usually used as condensation catalysts for condensation type silicone resin compositions, they have never been used in an addition-curable silicone resin composition such as that provided by the present invention.

As the monovalent hydrocarbon group that is represented by R and has 1 to 10 carbon atoms, there can be listed, for example, alkyl groups such as a methyl group, an ethyl group, a propyl group, an isopropyl group, a butyl group, an isobutyl group, a tert-butyl group, a pentyl group, a neopentyl group, a hexyl group, an octyl group, a nonyl group and a decyl group.

As the acyl group that is represented by R and has 2 to 15 carbon atoms, there can be listed, for example, an acetyl group, a propionyl group, a butanoyl group, an isobutanoyl group, a tert-butanoyl group, a heptanoyl group, a hexanoyl group, a 2-ethylbutanoyl group, an octanoyl group, a 2-ethylhexanoyl group, a nonanoyl group, a decanoyl group, a dodecanoyl group, a tridecanoyl group, a tetradecanoyl group, a benzoyl group and a naphthoyl group.

Specific examples of the component (D) include dimethoxy barium, diethoxy barium, diisopropoxy barium, di-n-propoxy barium, di-n-butoxy barium, diisobutoxy barium, di-sec-butoxy barium, di-t-butoxy barium, barium octanoate and barium 2-ethylhexanoate.

The component (D) may comprise only one kind thereof, or two or more kinds thereof.

The abovementioned barium compound may be either directly added to the components (A) to (C) and an optional component(s) that are added if necessary; or diluted by a solvent before being added to these components. Further, before being added to the components (A) to (C) and so on, the barium compound may be treated with heat; or treated with any kind of silicone resin or silane coupling agent. Particularly, the storage stability of the barium compound can be improved by mixing in advance such barium compound with a part of the component (A2) or with the whole component (A2).

Examples of a silane coupling agent used to treat the component (D) in advance include, but are not limited to the following compounds or their condensation reaction products.

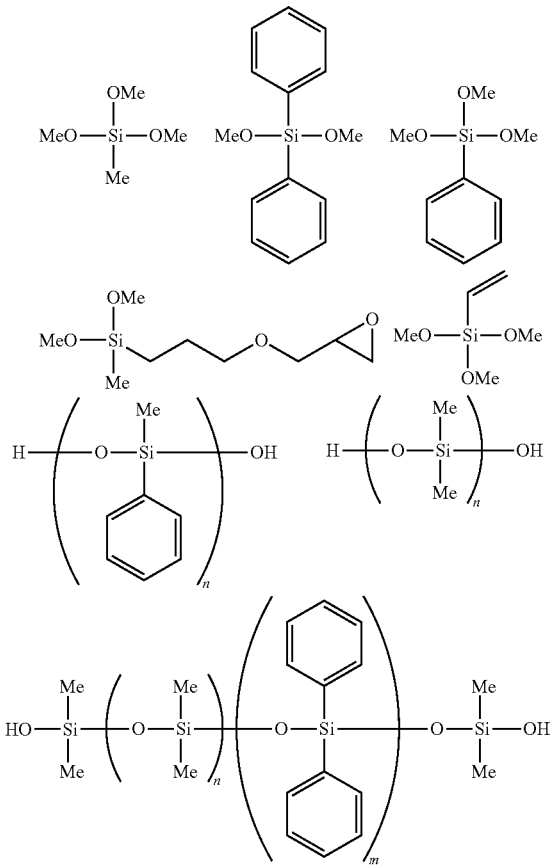

In the above formulae, n represents an integer of 0 to 100, and m also represents an integer of 0 to 100. Me represents a methyl group.

The component (A) is added in an amount of 60 to 90% by mass, preferably 70 to 85% by mass, per a total amount of the components (A) to (D).

The component (B) is added in an amount of 5 to 40% by mass, preferably 10 to 35% by mass, per the total amount of the components (A) to (D).

The component (C) is added in an amount of 0.00001 to 0.01% by mass, preferably 0.0001 to 0.001% by mass, in terms of platinum group metal per the total amount of the components (A) to (D).

The component (D) is added in an amount of 0.001 to 10.0% by mass, preferably 0.002 to 5.0% by mass, per the total amount of the components (A) to (D). When the component (D) is in an amount of not smaller than 0.001% by mass, there does not exist a concern that resin deterioration will occur. When the component (D) is in an amount of not larger than 10% by mass, there does not exist a concern that resin properties will change.

(E) Phosphor

A phosphor (E) may be further added to the addition-curable organopolysiloxane resin composition of the invention if necessary. Since the addition-curable organopolysiloxane resin composition of the invention is superior in heat resistance and light resistance, there does not exist a concern that a fluorescence property will be significantly impaired as it always would in the past, even when the composition contains a phosphor.

Other than the abovementioned components (A) to (E), known adhesion imparting agents, curing inhibitors and/or additive agents may be further added to the addition-curable organopolysiloxane resin composition of the invention if necessary.

Examples of such adhesion imparting agents include phenyltrimethoxysilane, trimethoxysilane, triethoxysilane, methyldimethoxysilane, diphenyldimethoxysilane, methylphenyldimethoxysilane, vinyltrimethoxysilane, vinyltriethoxysilane, 2-(3,4-epoxycyclohexyl) ethyltrimethoxysilane, 3-glycidoxypropyltrimethoxysilane, 3-glycidoxypropylmethyldiethoxysilane, 3-glycidoxypropyltriethoxysilane, 3-methacryloxypropylmethyldiethoxysilane, 3-methacryloxypropyltriethoxysilane, N-2 (aminoethyl) 3-aminopropylmethyldimethoxysilane, N-2 (aminoethyl) 3-aminopropyltrimethoxysilane, N-2 (aminoethyl) 3-aminopropyltriethoxysilane, N-phenyl-3-aminopropyltrimethoxysilane, 3-mercaptopropyltrimethoxysilane, 3-isocyanatopropyltriethoxysilane, 3-cyanopropyltriethoxysilane and oligomers of these agents. Here, any one of the above adhesion imparting agents may be used alone, or two or more of them may be used in combination. Further, it is preferred that such adhesion imparting agent(s) be added in an amount of 0 to 10% by mass, particularly preferably 0 to 5% by mass, per the total mass of the components (A) and (B).

As for the curing inhibitors, there may be used only one kind of them, or two or more kinds of them may be used in combination. Examples of such curing inhibitors include compounds selected from the group consisting of: a vinyl group-rich organopolysiloxane such as tetramethyltetravinylcyclotetrasiloxane; triallyl isocyanurate; alkyl maleate; acetylene alcohols; silane-modified products of acetylene alcohols; siloxane-modified products of acetylene alcohols; hydroperoxide; tetramethylethylenediamine; benzotriazole; and mixtures of these inhibitors.

The curing inhibitor(s) are normally added in an amount of 0.001 to 1.0 parts by mass, preferably 0.005 to 0.5 parts by mass, per a total of 100 parts by mass of the components (A) and (B).

Examples of the additive agents include reinforcing inorganic fillers (e.g. silica, glass fiber and fumed silica); non-reinforcing inorganic fillers (e.g. calcium carbonate, calcium silicate, titanium dioxide, ferric oxide, carbon black and zinc oxide); and nanofillers (e.g. silicon dioxide (silica: $SiO_2$), zirconium oxide (zirconia: $ZrO2$), titanium oxide ($TiO_2$), aluminum oxide (alumina: $Al_2O_3$), zinc oxide (ZnO), iron oxide ($FeO_2$), triiron tetraoxide ($Fe_3O_4$), lead oxide ($PbO_2$), tin oxide ($SnO_2$), cerium oxide ($Ce_2O_3$, $CeO_2$), calcium oxide (CaO), trimanganese tetraoxide ($Mn_3O_4$), magnesium oxide (MgO) and barium oxide (BaO)). These additive agents may be appropriately added in an amount of not larger than 600 parts by mass (i.e. 0 to 600 parts by mass, preferably 1 to 600 parts by mass, more preferably 10 to 400 parts by mass) per a total of 100 parts by mass of the components (A) to (D).

The addition-curable organopolysiloxane resin composition of the invention can be applied to a given base material according to the intended use, and cured thereafter. Although the composition of the invention can be sufficiently cured at normal temperature (25° C.), it may also be cured by heating if necessary. If heated, a heating temperature may, for example, be 60 to 200° C.

Further, it is preferred that the addition-curable organopolysiloxane resin composition of the invention be that capable of forming a cured product exhibiting a light transmissibility of not lower than 70%, preferably not lower than 80%, at a wavelength of 400 to 800 nm, particularly at a wavelength of 450 nm, when heated and thus cured at a thickness of 1 mm. Here, a spectrophotometer U-4100 (by Hitachi High-Technologies Corporation) may, for example, be used to measure the light transmissibility.

Moreover, the addition-curable organopolysiloxane resin composition of the invention is that capable of forming a cured product exhibiting a refractive index of 1.40 to 1.70, preferably 1.45 to 1.56, when cured by heating.

A cured product having such light transmissibility and refractive index is superior in transparency. That is, a composition capable of forming such a kind of cured product can be particularly favorably used for optical purposes such as LED sealing materials.

The aforementioned addition-curable organopolysiloxane resin composition of the invention is capable of forming a cured product superior in mechanical property, transparency, crack resistance, light resistance and heat resistance.

Semiconductor Device

Further, the present invention provides a semiconductor device with its semiconductor element(s) being encapsulated by the cured product of the addition-curable organopolysiloxane resin composition of the invention.

As mentioned above, since the addition-curable organopolysiloxane resin composition of the invention is capable of forming a cured product superior in transparency and heat resistance, the composition can be favorably used as, for example, a material for a lens in a light-emitting semiconductor device; a protection coating agent for use in such device; and a molding agent for use in such device as well. The composition of the invention is particularly useful when used to encapsulate LED elements such as blue LED, white LED and purple LED. Further, since the addition-curable organopolysiloxane resin composition of the invention is superior in heat resistance, there can be provided a light-emitting semiconductor device ensuring a long-term reliability under a high-humidity environment, and exhibiting a favorable moisture resistance and long-term color rendering property, even when a silicate-based phosphor and/or a quantum dot phosphor have been added to the composition, and the composition is now used as a material for a wavelength conversion film.

The addition-curable organopolysiloxane resin composition of the invention is used to encapsulate a light-emitting semiconductor element such as an LED as follows. For example, the addition-curable organopolysiloxane resin composition of the invention is to be applied to an LED element(s) that have been mounted on a pre-mold package made of a thermoplastic resin, followed by curing the composition on the LED element(s) so as to allow the LED element(s) to be sealed by the cured product of the addition-curable organopolysiloxane resin composition. Further, a varnish prepared by dissolving the composition in an organic solvent such as toluene and xylene may also be applied to a LED element(s) so as to encapsulate the same.

The addition-curable organopolysiloxane resin composition of the invention has superior properties such as heat resistance, light resistance (ultraviolet light resistance in particular), transparency, crack resistance and long-term reliability. Thus, the composition of the invention is the most suitable material for optical purposes in a sense that this composition can be used as a display material, an optical recording medium material, an optical apparatus material, an optical component material, an optical fiber material, a photoelectronic organic material, a semiconductor integrated circuit peripheral material or the like.

WORKING EXAMPLE

The present invention is described in detail hereunder with reference to working and comparative examples. However, the present invention is not limited to the working examples below. Here, "part(s)" refer to "part by mass," and viscosity refers to a value measured at 25° C. Further, Me represents a methyl group, Vi represents a vinyl group, Ph represents a phenyl group, and Mw represents weight-average molecular weight.

Working Example 1

An addition-curable organopolysiloxane resin composition was prepared by mixing and thoroughly stirring (A1): 5 parts of an organopolysiloxane (viscosity: 4,000 mPa·s) represented by the following formula

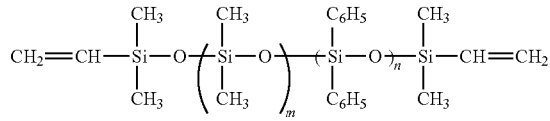

(m=10 (average value), n=8 (average value));

(A2): 30 parts of a resin-structure vinylphenylmethylpolysiloxane (PVMQ; Mw=2,000, hydroxyl group amount: 0.06 mol/100 g, alkoxy group (methoxy group) amount: 0.1 mol/100 g comprised of 36 mol % of $SiO_{4/2}$ unit, 36 mol % of $Ph2SiO_{2/2}$ unit and 28 mol % of $ViMe_2SiO_{1/2}$ unit;

(B): 13 parts of an organohydrogenpolysiloxane (an amount at which SiH/SiVi ratio becomes 1.0) represented by the following formula

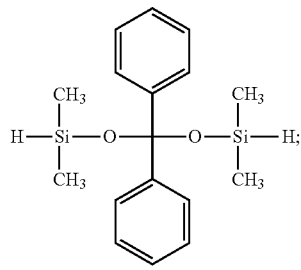

(D): 0.0005 parts of diisopropoxy barium (an amount of 0.001% by mass per the total amount of the components (A) to (D)); and (C): 0.05 parts of an octyl alcohol-modified solution of chloroplatinic acid (platinum element content: 2% by mass).

This composition was then heated at 150° C. for four hours so as to be molded into a cured product (120 mm×110 mm×1 mm). The following properties of this cured product were measured.

Working Example 2

A cured product was obtained in a similar manner as the working example 1, except that, instead of the component (A2) used in the working example 1, there were used 30 parts of a resin-structure vinylphenylmethylpolysiloxane (Mw=1,800, hydroxyl group amount: 0.05 mol/100 g) comprised of 70 mol % of $PhSiO_{3/2}$ unit, 2 mol % of $MeViSiO_{2/2}$ unit and 28 mol % of $ViMe_2SiO_{1/2}$ unit. The following properties of this cured product were measured.

Working Example 3

A cured product was obtained in a similar manner as the working example 1, except that the amount of the component (D) added in the working example 1 was now changed to 5 parts (i.e. 10% by mass per the total amount of the components (A) to (D)). The following properties of this cured product were measured.

Working Example 4

A cured product was obtained in a similar manner as the working example 1, except that the component (D) used in the working example 1 was now changed to 0.2 parts of barium 2-ethylhexanoate (i.e. 3.8% by mass per the total amount of the components (A) to (D)). The following properties of this cured product were measured.

Comparative Example 1

A cured product was obtained in a similar manner as the working example 1, except that the amount of the component (D) added in the working example 1 was now changed to 0.0003 parts (i.e. 0.0006% by mass per the total amount of the components (A) to (D)). The following properties of this cured product were measured.

Comparative Example 2

A cured product was obtained in a similar manner as the working example 1, except that the amount of the component (D) added in the working example 1 was now changed to 7.5 parts (i.e. 13.0% by mass per the total amount of the components (A) to (D)). The following properties of this cured product were measured.

Comparative Example 3

A cured product was obtained in a similar manner as the working example 1, except that the component (D) used in the working example 1 was now changed to 1 part of cerium 2-ethylhexanoate (i.e. 2% by mass per the total amount of the components (A) to (D)). The following properties of this cured product were measured.

Comparative Example 4

A cured product was obtained in a similar manner as the working example 1, except that the component (D) used in the working example 1 was now changed to 1 part of tetra-n-butoxy zirconium (i.e. 2% by mass per the total amount of the components (A) to (D)). The following properties of this cured product were measured.

The properties of the cured products obtained in the working examples 1 to 4; and comparative examples 1 to 4 were measured by the following methods. The results thereof are shown in Table 1.

(1) Refractive Index

The refractive index of each cured product at 25° C. was measured by an Abbe's refractometer, in accordance with JIS K0061:2001

(2) Hardness (Type D)

The composition obtained was cured after being heated at 150° C. for four hours. The hardness of each cured product was measured by a durometer type D, in accordance with JIS K6249:2003.

(3) Light Transmissibility (Heat Resistance)

The spectrophotometer U-4100 (by Hitachi High-Technologies Corporation) was used to measure the light transmissibility (at 450 nm) of the cured product (thickness 1 mm) at 23° C. (i.e. initial transmissibility). The cured product was then heated at 200° C. for 1,000 hours, followed by measuring the light transmissibility thereof in the similar manner so as to calculate a change in the transmissibility before and after the heat treatment i.e. a change from the initial transmissibility.

(4) Surface Tackiness

Whether dust had adhered to the surface of the cured product was visually confirmed.

(5) Adhesion

The composition obtained was taken by an amount of 0.25 g, and was applied to a silver plate having an area of 180 mm² in a manner such that a contact area between the composition and the silver plate would become 45 mm². The composition was then cured after being heated at 150° C. for four hours. The cured product formed on the silver plate was then destroyed and peeled therefrom, using a micro spatula. Here, observed was a ratio between parts exhibiting cohesive failure and parts where the cured product had been peeled away. A total area of the parts where the cured product had undergone cohesive failure was thus able to be measured, thereby allowing there to be calculated a ratio of a total area of the parts exhibiting cohesive failure to the aforementioned contact area involving the silver plate. The adhesiveness of the cured product was then evaluated based on the following criteria.

Criteria o: well adhered (ratio of parts exhibiting cohesive failure: 60% or higher)

x: poorly adhered (ratio of parts exhibiting cohesive failure: lower than 60%)

TABLE 1

| | Working example | | | | Comparative example | | | |
|---|---|---|---|---|---|---|---|---|
| | 1 | 2 | 3 | 4 | 1 | 2 | 3 | 4 |
| Refractive index | 1.53 | 1.53 | 1.53 | 1.53 | 1.53 | 1.53 | 1.53 | 1.53 |
| Hardness (type D) | 40 | 60 | 35 | 40 | 40 | 25 | 37 | 42 |
| Light transmissibility [450 nm] (%) Initial (%) | 100 | 100 | 100 | 96 | 100 | 100 | 80 | 97 |
| Light transmissibility [450 nm] (%) 200° C. × 1000 Hr (%) | 96 | 95 | 98 | 92 | 87 | 98 | 72 | 82 |
| Dust adherence due to surface tackiness | Not confirmed | Not confirmed | Not confirmed | Not confirmed | Not confirmed | Confirmed | Not confirmed | Not confirmed |
| Adhesion (Silver plate) | o | o | o | o | o | o | o | x |

As shown in Table 1, each cured product obtained in the working examples 1 to 4 exhibited a sufficient hardness, refractive index and mechanical property; and a high initial light transmissibility and heat resistance. In contrast, heat resistance worsened in the comparative example 1 where the component (D) had not been added in the given amount. With regard to the cured product obtained in the comparative example 2 where the component (D) had been added in an excessive amount, there were observed a decreased hardness and also an unfavorable surface tackiness. In the comparative example 3 where cerium 2-ethylhexanoate had been used instead of the component (D), there were observed a low initial transmissibility and an impaired heat resistance. In the comparative example 4 where tetra-n-butoxy zirconium had been used instead of the component (D), there were observed an impaired heat resistance and adhesiveness.

What is claimed is:

1. An addition-curable organopolysiloxane resin composition comprising:
   (A) an organopolysiloxane having in one molecule at least two silicon-atom-bonded alkenyl groups each having 2 to 10 carbon atoms, wherein component (A) comprises:
      (A1) 1 to 99% by mass of an aryl group-containing organopolysiloxane having, in one molecule, at least one silicon-atom-bonded aryl group having 6 to 10 carbon atoms and at least two silicon-atom-bonded alkenyl groups each having 2 to 10 carbon atoms, said aryl group-containing organopolysiloxane (A1) exhibiting a viscosity of 10 to 100,000 mPa·s at 25° C. when measured by a method described in JIS K 7117-1:1999; and
      (A2) 1 to 99% by mass of a resin-structure organopolysiloxane containing at least one of an $SiO_{4/2}$ unit and an $R^1SiO_{3/2}$ unit wherein each $R^1$ independently represents a monovalent hydrocarbon group having 1 to 10 carbon atoms and having, in one molecule, at least two silicon-atom-bonded alkenyl groups each having 2 to 10 carbon atoms and at least one silicon-atom-bonded hydroxyl group, said silicon-atom-bonded hydroxyl group(s) being present in an amount of 0.005 to 1.0 mol/100 g,
   provided that a total content of components (A1) and (A2) is 100% by mass of component (A),
   said organopolysiloxane being present in an amount of 60 to 90% by mass per a total amount of components (A) to (D);
   (B) an organohydrogenpolysiloxane having in one molecule at least two silicon-atom-bonded hydrogen atoms, said organohydrogenpolysiloxane also having, in one molecule, at least one silicon-atom-bonded aryl group having 6 to 10 carbon atoms, said organohydrogen-polysiloxane being present in an amount of 5 to 40% by mass per the total amount of components (A) to (D);
   (C) a platinum group metal-based catalyst, said platinum group metal-based catalyst being present in an amount of 0.00001 to 0.01% by mass in terms of platinum group metal, per the total amount of components (A) to (D); and
   (D) a barium compound that is present in an amount of 0.001 to 10.0% by mass per the total amount of components (A) to (D), and is represented by the following formula (1)

$$Ba(OR)_2 \qquad (1)$$

wherein R represents a monovalent hydrocarbon group having 1 to 10 carbon atoms or an acyl group having 2 to 15 carbon atoms.

2. An addition-curable organopolysiloxane resin composition, comprising:
(A) an organopolysiloxane having in one molecule at least two silicon-atom-bonded alkenyl groups each having 2 to 10 carbon atoms, said organopolysiloxane being present in an amount of 60 to 90% by mass per a total amount of components (A) to (D);
(B) an organohydrogenpolysiloxane having in one molecule at least two silicon-atom-bonded hydrogen atoms, said organohydrogenpolysiloxane being present in an amount of 5 to 40% by mass per the total amount of components (A) to (D);
(C) a platinum group metal-based catalyst, said platinum group metal-based catalyst being present in an amount of 0.00001 to 0.01% by mass in terms of platinum group metal per the total amount of components (A) to (D); and
(D) a barium compound that is present in an amount of 0.001 to 10.0% by mass per the total amount of components (A) to (D), wherein component (D) comprises at least one compound selected from dimethoxy barium, diethoxy barium, diisopropoxy barium, di-n-propoxy barium, di-n-butoxy barium, diisobutoxy barium, di-sec-butoxy barium, di-t-butoxy barium, barium octanoate, and barium 2-ethylhexanoate.

3. A cured product of an addition-curable organopolysiloxane resin composition comprising:
(A) an organopolysiloxane having in one molecule at least two silicon-atom-bonded alkenyl groups each having 2 to 10 carbon atoms, wherein component (A) comprises:
(A1) 1 to 99% by mass of an aryl group-containing organopolysiloxane having, in one molecule, at least one silicon-atom-bonded aryl group having 6 to 10 carbon atoms and at least two silicon-atom-bonded alkenyl groups each having 2 to 10 carbon atoms, said aryl group-containing organopolysiloxane (A1) exhibiting a viscosity of 10 to 100,000 mPa·s at 25° C. when measured by a method described in JIS K 7117-1:1999; and
(A2) 1 to 99% by mass of a resin-structure organopolysiloxane containing at least one of an $SiO_{4/2}$ unit and an $R^1SiO_{3/2}$ unit wherein each $R^1$ independently represents a monovalent hydrocarbon group having 1 to 10 carbon atoms and having, in one molecule, at least two silicon-atom-bonded alkenyl groups each having 2 to 10 carbon atoms and at least one silicon-atom-bonded hydroxyl group, said silicon-atom-bonded hydroxyl group(s) being present in an amount of 0.005 to 1.0 mol/100 g,
provided that a total content of components (A1) and (A2) is 100% by mass of component (A),
said organopolysiloxane being present in an amount of 60 to 90% by mass per a total amount of components (A) to (D);
(B) an organohydrogenpolysiloxane having in one molecule at least two silicon-atom-bonded hydrogen atoms, said organohydrogenpolysiloxane also having, in one molecule, at least one silicon-atom-bonded aryl group having 6 to 10 carbon atoms, said organohydrogen-polysiloxane being present in an amount of 5 to 40% by mass per the total amount of components (A) to (D);
(C) a platinum group metal-based catalyst, said platinum group metal-based catalyst being present in an amount of 0.00001 to 0.01% by mass in terms of platinum group metal, per the total amount of components (A) to (D); and
(D) a barium compound that is present in an amount of 0.001 to 10.0% by mass per the total amount of components (A) to (D), and is represented by the following formula (1)

$$Ba(OR)_2 \qquad (1)$$

wherein R represents a monovalent hydrocarbon group having 1 to 10 carbon atoms or an acyl group having 2 to 15 carbon atoms.

4. A semiconductor device comprising the cured product as set forth in claim 3.

5. A cured product of an addition-curable organopolysiloxane resin composition comprising:
(A) an organopolysiloxane having in one molecule at least two silicon-atom-bonded alkenyl groups each having 2 to 10 carbon atoms, said organopolysiloxane being present in an amount of 60 to 90% by mass per a total amount of components (A) to (D);
(B) an organohydrogenpolysiloxane having in one molecule at least two silicon-atom-bonded hydrogen atoms, said organohydrogenpolysiloxane being present in an amount of 5 to 40% by mass per the total amount of components (A) to (D);
(C) a platinum group metal-based catalyst, said platinum group metal-based catalyst being present in an amount of 0.00001 to 0.01% by mass in terms of platinum group metal per the total amount of components (A) to (D); and
(D) a barium compound that is present in an amount of 0.001 to 10.0% by mass per the total amount of components (A) to (D), wherein component (D) comprises at least one compound selected from dimethoxy barium, diethoxy barium, diisopropoxy barium, di-n-propoxy barium, di-n-butoxy barium, diisobutoxy barium, di-sec-butoxy barium, di-t-butoxy barium, barium octanoate, and barium 2-ethylhexanoate.

6. A semiconductor device comprising the cured product as set forth in claim 5.

* * * * *